United States Patent [19]
Bouchard

[11] Patent Number: 6,077,356
[45] Date of Patent: Jun. 20, 2000

[54] REAGENT SUPPLY VESSEL FOR CHEMICAL VAPOR DEPOSITION

[75] Inventor: Fred Bouchard, New Milford, Conn.

[73] Assignee: Advanced Technology Materials, Inc., Danbury, Conn.

[21] Appl. No.: 08/992,932

[22] Filed: Dec. 17, 1997

Related U.S. Application Data

[60] Provisional application No. 60/033,865, Dec. 17, 1996.

[51] Int. Cl.[7] ............................. C23C 16/00; B67D 5/08; B67D 5/60
[52] U.S. Cl. ............................ 118/715; 118/726; 222/61; 222/66; 222/464.7
[58] Field of Search ................................... 118/715, 726; 222/61, 66, 464.7

[56] References Cited

U.S. PATENT DOCUMENTS

| | | | |
|---|---|---|---|
| 4,676,404 | 6/1987 | Yamazaki et al. | 222/56 |
| 5,102,010 | 4/1992 | Osgar et al. | 222/1 |
| 5,366,119 | 11/1994 | Kline | 222/180 |
| 5,366,120 | 11/1994 | Tollasepp | 222/377 |
| 5,372,754 | 12/1994 | Ono | 261/142 |
| 5,383,970 | 1/1995 | Asaba et al. | 118/726 |
| 5,388,574 | 2/1995 | Raphael | 222/1 |
| 5,435,460 | 7/1995 | Osgar | 222/1 |
| 5,526,956 | 6/1996 | Osgar | 222/83 |
| 5,582,647 | 12/1996 | Kato et al. | 118/715 |
| 5,749,500 | 5/1998 | Kraus | 222/377 |

OTHER PUBLICATIONS

"Cylinders and Bubblers," Morton Metalorganics Catalog, Oct. 1995.
"Apache ASME Portable Stainless Pressure Vessels,"Apache Stainless Equipment Corporation Catalog, Nov. 1995.
"Apache ASME Portable Stainless Pressure Vessel,"Apache Stainless Equipment Corporation Catalog, Jul. 1994.
"Ultra–Ware Five Valve Cap System," Kontes Mobile Phase Handling Brochure, p. 709.

*Primary Examiner*—Richard Bueker
*Assistant Examiner*—Jeffrie R Lund
*Attorney, Agent, or Firm*—Steven J. Hultquist; Oliver A.M. Zitzmann

[57] ABSTRACT

A liquid reagent dispensing assembly, comprising a gas-pressurizable vessel including a floor, and an interior volume bounded by interior wall and floor surfaces. A dip-tube liquid discharge conduit is employed for discharging liquid from the gas-pressurized vessel. The vessel is provided with a liquid level sensor for sensing liquid reagent level in the vessel interior volume. The floor of the vessel has a cavity therein extending downwardly from the surface of the floor, and the lower end of the dip tube is positioned in the cavity. The dispensing assembly of the invention may usefully be employed for dispensing of reagents such as precursors for deposition of materials in the manufacture of semiconductor materials and devices, and achieves a high level of withdrawal of the reagent liquid from the vessel.

32 Claims, 1 Drawing Sheet

REAGENT SUPPLY VESSEL FOR CHEMICAL VAPOR DEPOSITION

CROSS-REFERENCE TO RELATED APPLICATION

This claims the priority of United States Provisional Patent Application No. 60/033,685 filed Dec. 17, 1996.

BACKGROUND OF THE INVENTION

1. Field of the Invention

The present invention relates generally to a closed vessel liquid reagent dispensing assembly of the type in which liquid is dispensed from a dip-tube liquid discharge conduit from a gas-pressurized vessel, and in which the liquid level may be sensed by a sensor extending downwardly in the vessel and terminating just short of the floor thereof.

2. Description of the Related Art

In the field of chemical vapor deposition using liquid delivery systems for the supply of a liquid reagent to a vaporizer, wherein the liquid is vaporized by the vaporizer and passed to a chemical vapor deposition reactor for forming the desired material layer on a substrate from the reagent vapor, the liquid reagents employed are often costly.

This is particularly true in instances where the material sought to be deposited in the chemical vapor deposition operation is a precious metal or rare element, or where the liquid reagent is difficult and/or expensive itself to synthesize. Examples include many liquid reagents for liquid delivery chemical vapor deposition manufacturing of semi-conductor and superconductor devices and precursor structures thereof, e.g., liquid source compounds, and solutions of solubilizable or suspendable source compounds, for platinum, gold, titanium, lead, palladium, zirconium, bismuth, strontium, barium, calcium, antimony, thallium, tantalum, etc.

Owing to the costly character of such liquid reagents, it is obviously desirable to maximize the utilization of the reagent in a given application, and to minimize wastage or loss of the valuable liquid reagent material.

The conventional supply vessel assembly used in liquid delivery chemical vapor deposition operations typically comprises a closed vessel including floor and wall members defining an interior volume, bounded by interior floor and wall surfaces, for holding liquid reagent.

The vessel is coupled with pressurized gas supply means for introducing pressurized gas into the interior volume of the vessel, to thereby pressurizingly dispense liquid reagent from the vessel. For such purpose, the vessel may be provided with a "pressurization post," or inlet tube, which is joined by a conduit to a source of pressurized gas, such as a high pressure gas cylinder containing a displacement gas such as nitrogen, argon, or other suitable gas species, which serves to impose pressure on the volume of liquid reagent in the vessel, to cause the egress of liquid from the vessel under dispensing conditions.

Liquid is discharged from such vessel by a "dip tube," or liquid discharge tube, which is arranged to extend upwardly and exteriorly of the vessel, from a lower open end in close proximity to the flat or generally planar floor surface of the vessel's interior volume. The aforementioned pressurization of the liquid reagent under dispensing conditions thereby causes the liquid reagent to flow into the open lower end of the dip tube and upwardly therethrough for discharge exteriorly of the vessel, e.g., into a line feeding the vaporizer for the chemical vapor deposition unit, whereby reagent source vapor is formed and subsequently introduced to the chemical vapor deposition reactor for the deposition of a material layer on the substrate therein.

The conventional liquid reagent vessel of the above-described character also is equipped with a liquid level sensor, of a type extending downwardly in the interior volume and terminating at a lower end in close proximity to the floor surface in the interior volume of the vessel. The sensor is designed to detect the level of the liquid as it is being depleted.

The liquid level sensor and the dip tube need a certain height of liquid to function properly. If the liquid level is too low, then the level sensor can cease to function and more importantly, gas can be pressurized up the dip tube. The passage of gas up the dip tube is undesirable in liquid delivery applications, since the "bypassing" gas replaces the liquid sought to be vaporized in the egressing fluid. As a result, the vaporizer may overheat or develop hot spots, and the downstream process may be starved of the desired flux or flow rate of source vapor, which in turn can cause the deposited material to be stoichiometrically or otherwise compositionally deficient or even useless for its intended purpose.

To overcome this problem, it has been conventional practice to utilize only 80–90% of the liquid reagent volume originally provided in the vessel, meaning that 10 to 20% of the original volume of reagent liquid is not used (and therefore wasted), to ensure that the liquid level is high enough for liquid level sensing at all times. Because the semiconductor manufacturing process operates in a batch process fashion, with respect to the deposition of constituent materials on the wafer substrate from the vaporized source material, the non-used reagent from the supply vessel becomes part of the overall waste from the semiconductor manufacturing plant.

In instances where the liquid reagent is costly and valuable, such wastage of the liquid reagent severely adversely impacts the process economics, as well as representing a significant burden in terms of disposition of the waste liquid and its environmental impact.

Accordingly, it would be a significant advance in the art, and is accordingly an object of the present invention, to provide an improved liquid reagent supply means and method which increases the usage of the liquid reagent, and correspondingly reduces waste thereof, relative to liquid reagent supply means and method of the prior art.

Other objects and advantages of the present invention will be more fully apparent from the ensuing disclosure and appended claims.

SUMMARY OF THE INVENTION

The present invention relates to an apparatus for dispensing a liquid reagent, in which the liquid reagent is dispensed from a dip-tube liquid discharge conduit from a gas-pressurized vessel, and in which the floor of the gas-pressurized vessel provides a sump cavity in which the lower end of the dip-tube liquid discharge conduit is disposed.

Such arrangement achieves higher utilization of the liquid than the flat-floored vessel constructions of the prior art.

In a specific aspect, the invention relates to a liquid reagent dispensing assembly, comprising:

a gas-pressurizable vessel including a floor, and an interior volume bounded by interior wall and floor surfaces, a dip-tube liquid discharge conduit for discharging liquid from the gas-pressurized vessel, wherein the dip tube extends downwardly in the interior volume of the vessel to a lower end of the dip tube disposed in a lower portion of the interior volume, a liquid level sensor for sensing liquid reagent level in the vessel interior volume, the floor of the vessel having a cavity therein extending downwardly from the surface of the floor, and the lower end of the dip tube being positioned in the cavity.

In such assembly, the liquid level sensor may for example include a sensor element extending downwardly and terminating at a lower end positioned in the sump cavity structure.

In one embodiment, the sump cavity is configured as a dual well structure in the floor member of the vessel, with one well containing the lower extremity of the dip tube, and the other well containing the lower end of the liquid sensor element.

The liquid reagent dispensing assembly may in another embodiment include a liquid reagent flow circuit joining the dip-tube liquid discharge conduit in reagent liquid flow communication with a liquid delivery chemical vapor deposition system including a vaporizer and chemical vapor deposition chamber.

The sump cavity may suitably occupy a minor fraction, e.g., 25% or less, of the cross-section floor surface area of the vessel, and be readily constructed by machining, milling, boring or routing of the floor member of the vessel.

The reagent supply vessel assembly of the invention may be employed in a wide variety of process systems, including for example chemical vapor deposition systems wherein the liquid reagent from the supply vessel is passed to a vaporizer and vaporized to form a source vapor which is flowed to a chemical vapor deposition chamber for deposition of a material layer on a substrate therein from the source vapor.

Other aspects, features and embodiments of the invention will be more fully apparent from the ensuing disclosure and appended claims.

DETAILED DESCRIPTION OF THE INVENTION AND PREFERRED EMBODIMENTS THEREOF

Figure 1:
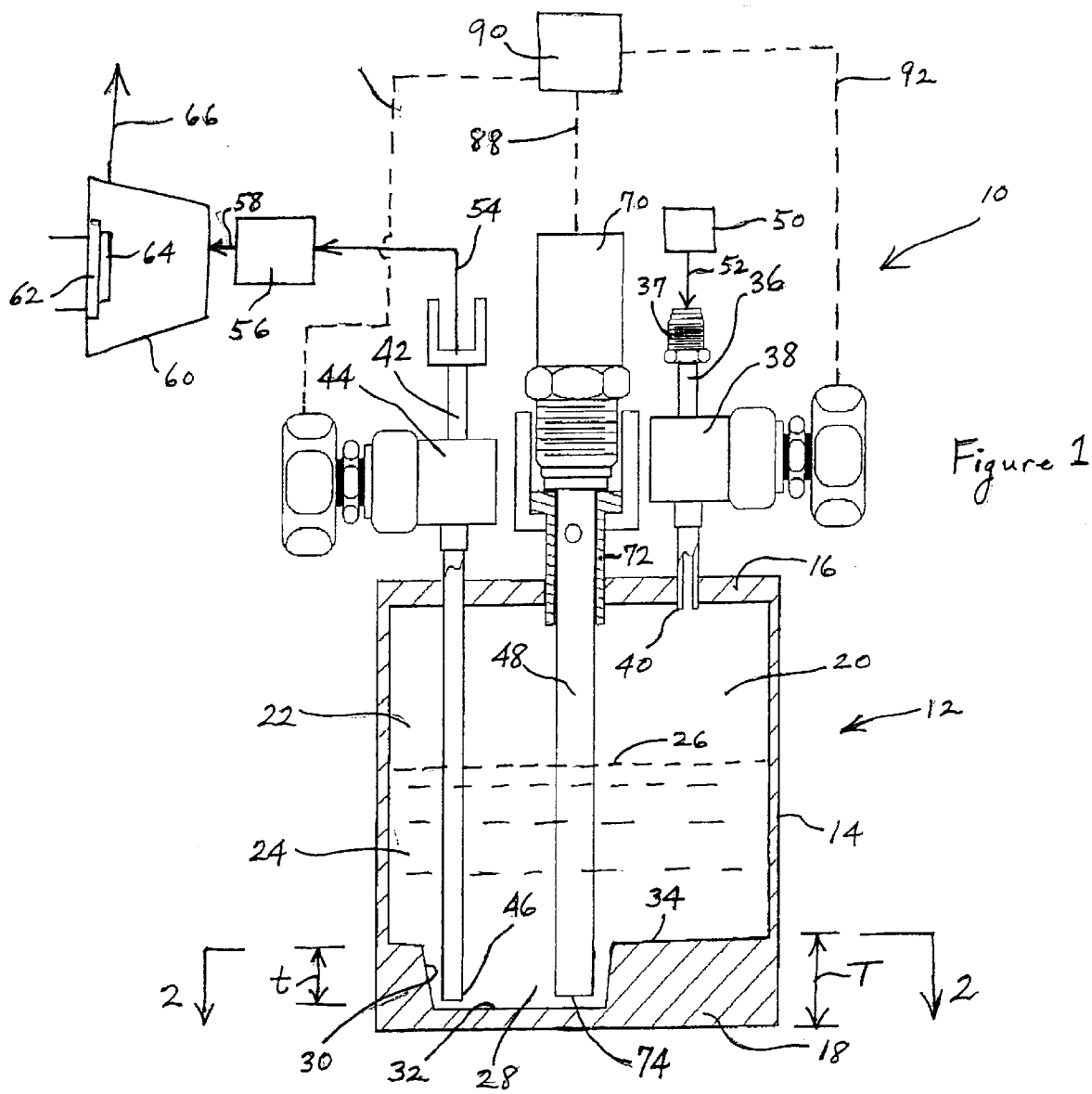
FIG. 1 is a schematic representation of a chemical vapor deposition system including a reagent supply vessel shown in elevation view and partial cross-section, according to an illustrative embodiment of the invention.

Referring to the drawings, FIG. 1 is a schematic representation of a chemical vapor deposition system 10 including a reagent supply vessel assembly shown in elevation view and partial cross-section, according to an illustrative embodiment of the invention.

In this system, the reagent supply vessel 12 includes side wall member 14, which may for example comprise a cylindrical wall or wall segments corporately defining an enclosing side wall structure, e.g., of square or other non-circular cross-section, top wall member 16 and floor member 18. The side wall, top wall and floor members define an enclosed interior volume 20 of the vessel, which in operation may contain a gas space 22 overlying a liquid 24 defining a liquid surface 26 at the gas-liquid interface.

In accordance with the invention, the floor member 18, which as shown in FIG. 1 has a main floor surface 34, is provided with a sump cavity 28 therein. The sump cavity 28 extends downwardly from the main floor surface 34 into the floor member 18, and is bounded by the subfloor surface 32 and the bounding side wall surface 30 of the cavity.

The reagent supply vessel 12 is equipped with pressurized gas introduction means, which in the embodiment shown comprises a pressurized gas feed tube 36 having a gas flow control valve 38 coupled therewith to control the flow of pressurized gas into the interior volume of the reagent supply vessel. The gas feed tube 38 may as illustrated pass through a suitable opening in the top wall member 16 of the vessel, and terminate at an open lower end 40 in the gas space 22 of the interior volume.

The gas feed tube 36 is joined by coupling 37 to a supply line 52 from the gas supply unit 50, so that the pressurized gas from the supply unit 50 flows through supply line 52 to gas feed tube 36 and is discharged in the gas space 22 of the vessel at the open lower end 40 of the gas feed tube, to exert pressure on the surface 26 of the liquid 24 for dispensing of the liquid as hereafter more fully described. The gas supply unit 50 may be of any suitable type, as for example a high pressure gas cylinder, a cryogenic air separation plant, or a pressure swing air separation unit, furnishing pressurizing gas, e.g., nitrogen, argon, oxygen, etc., to the supply line 52.

The vessel 12 also is equipped with a dip tube 42 extending from a lower open end 46 in the interior volume of the vessel, to an upper end exteriorly of the vessel, which is joined to a liquid feed line 54. The dip tube thus passes through the top wall member 16 of the vessel, and is coupled to a flow control valve 44 as shown, for selectively adjusting the flow rate of the dispensed liquid which is flowed through the dip tube to line 54. The dip tube lower open end 46 is positioned in close proximity to the sub-floor surface 32. The spacing between the lower open end 46 of the dip tube and the sub-floor surface is selected so that the lower open end 46 is as close as possible to the sub-floor surface without interfering with the flow of liquid 24 into the interior passage of the dip tube. For example, the lower end of the dip tube may be in sufficiently close proximity to the sub-floor surface of the sump cavity to permit high levels, e.g., at least 90% of the liquid contained in the vessel to be dispensed without gas bypassing.

The exact clearance between the lower open end 46 of the dip tube and the sub-floor surface 32 will depend on various factors including the viscosity of the liquid being dispensed, the discharge flow rates of the liquid desired in operation of the chemical vapor deposition system, the inner diameter of the dip tube, the roughness of the interior surface of the dip tube, etc., but may be determined without undue experimentation by the simple expedient of varying the clearance dimension in successive test runs with a vertically adjustable dip tube of a design test vessel, and determining the output flows, pressure drop, etc. associated therewith, to select an appropriate clearance dimension for a specific end use application of the invention.

Liquid feed line 54 thus receives the liquid reagent which is discharged by the dip tube 42 from the reagent supply vessel 12, and flows same to the vaporizer 56 for the chemical vapor deposition system. In the vaporizer 56, the liquid reagent deriving from supply vessel 12 is vaporized to form a source vapor for the subsequent vapor deposition operation. The vaporizer 56 may also receive a carrier gas for combining with or shrouding the source vapor produced by vaporization of the liquid reagent. Alternatively, the source vapor may be passed to the downstream vapor deposition operation in neat form.

In any event, the source vapor from the vaporizer 56 is flowed in vapor feed line 58 to the chemical vapor deposition chamber 60. In the chemical vapor deposition chamber 60, a wafer 64 or other substrate element is mounted on a heatable susceptor 62 or other mount structure, in receiving relationship to the source vapor introduced to the chamber from vapor feed line 58.

The vapor is contacted with the wafer 64, to deposit thereon the desired component(s) of the source vapor, and form a resulting material layer or deposit on the wafer. The effluent gas from the chemical vapor deposition is discharged from chamber 60 in effluent discharge line 66, and may be passed to recycle, recovery, waste treatment, disposal, or other disposition means (not shown in FIG. 1).

Referring again to the reagent supply vessel 12, the vessel is equipped with a liquid level sensor 48 which extends from upper portion 70, downwardly through the collar 72 in the top wall member 16 of the vessel, to a lower end 74 in close proximity to the sub-floor surface 32 of the sump cavity 28 of the vessel. The upper portion 70 of the liquid level sensor 48 is connected by liquid level sensing signal transmission line 88 to a central processing unit 90, for transmission of sensed liquid level signals from the sensor 48 to the central processing unit during operation of the system.

The central processing unit 90, which may comprise suitable microprocessor, computer, or other appropriate control means, is also joined by control signal transmission line 92 to the valve 38 (e.g., via a suitable valve actuator element, not shown in the schematic illustration of FIG. 1) to selectively adjust the valve 38 and control the flow of pressurized gas to the reagent supply vessel.

The central processor unit 90 is also joined by control signal transmission line 94 to the liquid dispensing control valve 44 (e.g., via a suitable valve actuator element, not shown in the schematic illustration of FIG. 1), to control the flow of reagent liquid from the vessel 12 to the vaporizer 56.

As shown in FIG. 1, the sump cavity 28 has a depth t, measured as the vertical distance from the plane of the main floor surface 34 to the sub-floor surface 32, which is significant in relation to the thickness T of the floor member 18. By this arrangement, the lower ends 46 and 74 of the dip tube 42 and the liquid level sensor 48, respectively, as arranged in close proximity to the sump cavity sub-floor, to operate in the sub-volume of liquid in the sump cavity, and thereby increase the extent of utilization of the liquid 24 provided in the vessel.

Figure 2:
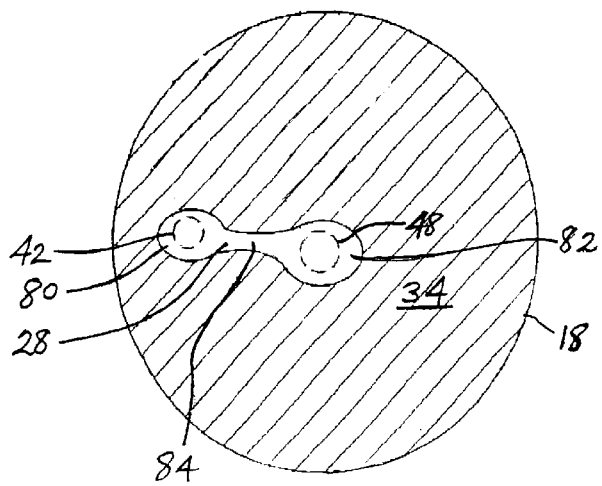
FIG. 2 is a cross-sectional plan view of the reagent source vessel of FIG. 1, taken along line 2–2 of FIG. 1.

FIG. 2 is a cross-sectional plan view of the liquid reagent supply vessel 12 of FIG. 1, taken along line 2—2 of FIG. 1. In this illustrative embodiment, the sump cavity 28 is of a generally dog-bone or dumbbell shape in top plan view, comprising the dip tube well 80, the liquid level sensor well 82, and the yoke passage 84 communicating wells 80 and 82 with one another.

The sump cavity 28 when viewed in such plan view is seen to occupy a minor portion of the cross-sectional floor area of the vessel. In general, such plan view cross-sectional area of the sump cavity is preferably less than about 25% of the total cross-sectional area of the vessel floor, and more preferably less than about 15% of the total cross-sectional area of the vessel floor. For example, the cross-sectional area of the sump cavity may be in the range of from about 5 to about 20% of the total cross-sectional area of the vessel (floor area). The side-walls of the sump cavity may be sloped, straight or of any other geometry or orientation.

It will be appreciated that the conformation, including the shape, geometry and dimensions, of the sump cavity in the practice of the present invention may be widely varied in practice.

For example, the sump cavity may comprise separate discrete wells for the respective dip tube and liquid level sensor lower end portions. These wells may be communicated with one another by a passage extending through the floor member of the supply vessel and communicating at respective ends with the wells in the vicinity of the sub-floor surfaces of the wells. Such interconnecting passage may for example be a generally horizontally extending passage, or it may for example comprise a U-shape or manometric-type passage between the respective wells of the floor member of the vessel, or it may have any other suitable shape and configuration for the purpose of communicating the wells or constituent parts of the sump cavity. Alternatively, the respective wells may be discrete and non-interconnected in character, being provided as separate bores or channels in the floor member of the vessel.

The sump cavity may be formed in the floor member of the liquid reagent supply vessel by any suitable manufacturing method, including casting, molding, etching, machining (drilling, milling, electric arc machining, etc.), or any other method providing a cavity structure in the floor member which provides a liquid holding volume of reduced cross-sectional area in the lower portion of the interior volume of the liquid reagent supply vessel, so that a given volume of liquid occupies a greater height than would be the case in an interior volume of uniform cross-sectional area over its entire vertical extent.

In some instances, it may be desirable to utilize liquid level sensors other than the type illustratively shown, in which the sensor does not extend downwardly in the vessel to a lower portion thereof, as in the embodiment shown, but which senses or monitors the liquid level in another manner, e.g., by a float sensor mechanism, or by ultrasonic or optical sensing of the liquid level in the vessel. In such instances, the liquid level sensor will not require a position or place in the sump cavity, and the sump cavity can be sized and arranged to accommodate only the dip tube element therein, thereby further minimizing the volume and cross-section of the sump cavity.

Nonetheless, the arrangement shown in FIGS. 1 and 2 utilizing a liquid level sensor of the type including a sensor element extending downwardly in the vessel to a lower end disposed in the lower portion of the vessel's interior volume, is generally preferred for reasons of simplicity, reliability and low cost.

In operation of the system illustrated with reference to FIGS. 1 and 2, liquid reagent is placed in the supply vessel 12, and pressurized gas is flowed from gas supply unit 50 through gas supply line 52 to the gas feed tube 36 from which it is discharged at open end 40 of the gas feed tube into the gas space 22 in the interior volume 20 of the vessel 12. The pressurized gas forces the liquid 24 into the lower end 46 of the dip tube 42, from which it flows into line 54 and is passed to the vaporizer 56 for vaporization therein.

After vaporization of the liquid reagent in vaporizer 56, the resulting reagent vapor is flowed in line 58 to the chemical vapor deposition chamber 60 for deposition of the desired material layer or deposit on the substrate 64, and discharge of effluent vapor from the chamber 60 in effluent discharge line 66.

During this operation, the liquid level of the liquid 24 in vessel 12 is detected by liquid level sensor 48. The liquid level defined by liquid surface 26 progressively declines and eventually lowers into the sump cavity 28 to a minimum liquid head (height of liquid in the sump cavity), at which point the central processing unit 90 receives a corresponding sensed liquid level signal by liquid level sensing signal transmission line 88. The central processing unit 90 responsively transmits a control signal in control signal transmission line 92 to the valve 38 to close the valve and shut off the flow of pressurized gas to the reagent supply vessel, and also concurrently transmits a control signal in control signal transmission line 94 to close the liquid dispensing control valve 44, to shut off the flow of reagent liquid from the vessel 12 to the vaporizer.

By acting at the end of the liquid dispensing operation on a reduced cross-section, increased height liquid volume in the sump cavity in accordance with the present invention, relative to the larger cross-section, lower height liquid volume which is characteristic of the reagent supply vessels of the prior art, the liquid sensor is able to monitor the liquid reagent to a closer approach to complete liquid utilization than has heretofore been possible.

At the same time, the placement of the lower inlet end of the dip tube liquid discharge conduit in the sump cavity of the vessel permits the liquid flow to be continued to a closer approach to complete exhaustion of the liquid contents of the vessel, without risk of slugging or bypassing of pressurizing gas into the liquid discharge conduit, than has been feasible in the practice of the prior art.

The means and method of the present invention thus achieves a substantial advance in the art, in the provision of a system for supply and dispensing of a liquid reagent, which permits 95–98% of the volume of the originally furnished liquid reagent to be utilized in the application for which the liquid reagent is selectively dispensed.

Correspondingly, in operations such as the manufacture of semiconductor and superconductor products, it is possible with the means and method of the present invention to reduce the wastage of the liquid reagent to levels as low as 2–5% of the volume originally loaded into the dispensing vessel.

Accordingly, the practice of the present invention markedly improves the economics of the liquid supply and dispensing system, and the process in which the dispensed liquid is employed. The invention in some instances may permit the cost-effective utilization of liquid reagents which were as a practical matter precluded by the wastage levels characteristic of prior art practice.

As a further benefit of the present invention, the reduced liquid inventory in the supply vessel at the end of the dispensing operation, relative to prior practice, permits the switch-over time, during which the exhausted supply vessel is changed out from the process system, and replaced with another vessel for further processing, to be minimized as a result of the greater on-stream time for the supply vessel owing to increased usage of the originally charged liquid therefrom, relative to such prior practice.

Thus, while the invention has been described with reference to various illustrative aspects, features and embodiments, it will be appreciated that the invention is not thus limited, but rather encompasses further variations, modifications and additional embodiments. Accordingly, the invention as hereafter claimed is intended to be broadly construed, as including all such further variations, modifications and additional embodiments within its spirit and scope.

What is claimed is:

1. A liquid reagent dispensing assembly, comprising:
   a gas-pressurizable vessel including a floor, and an interior volume bonded by interior wall and floor surfaces,
   a dip tube liquid discharge conduit for discharging liquid from the gas-pressurized vessel, wherein the dip tube extends downwardly in the interior volume of the vessel to a lower end of the dip tube disposed in a lower portion of the interior volume,
   a liquid level sensor for sensing liquid reagent level in the vessel interior volume,
   the floor of the vessel having a sump cavity therein extending downwardly from the surface of the floor,
   the lower end of the dip tube being positioned in said sump cavity, and
   the liquid level sensor comprising a sensor element extending downwardly and terminating at a lower end that is positioned in said sump cavity.

2. A liquid reagent dispensing assembly according to claim 1, further comprising a liquid reagent flow circuit joining the dip-tube liquid discharge conduit in reagent liquid flow communication with a liquid delivery chemical vapor deposition system.

3. A liquid reagent dispensing assembly according to claim 2, wherein the liquid reagent flow circuit contains a flow control valve to regulate flow rate of discharged liquid reagent through the circuit.

4. A liquid reagent dispensing assembly according to claim 1, wherein the sump cavity occupies a minor fraction of the area of the floor surface.

5. A liquid reagent dispensing assembly according to claim 1, wherein the sump cavity occupies less than 25% of the floor surface area.

6. A liquid reagent dispensing assembly according to claim 1, wherein the sump cavity has a dumbbell shape in top plan view of the floor surface.

7. A liquid reagent dispensing assembly according to claim 1, wherein the sump cavity comprises two transversely space-apart wells in liquid flow communication with one another, with one of the wells having the lower open end of the dip tube disposed therein and the other of the wells having the lower end of the liquid level sensor element disposed therein.

8. A liquid reagent supply vessel assembly, comprising:
   a vessel including floor and wall members defining an interior volume, bounded by interior floor and wall surfaces, for holding liquid reagent, and into which pressurized gas is introduceable to dispense liquid reagent from the vessel;
   a liquid level sensor element for sensing liquid level in the interior volume of the vessel;
   a liquid discharge tube, extending upwardly and exteriorly of the vessel, from a lower open end in the interior volume of the vessel;
   the floor member of the vessel having a sump cavity therein extending downwardly from a main floor surface of the floor member to a sub-floor surface of the sump cavity;
   the lower open end of the liquid discharge tube being positioned in the sump cavity, in close proximity to the sub-floor surface of the sump cavity; and
   the liquid level sensor element for sensing liquid level in the interior volume of the vessel extending downwardly to a lower end positioned in the sump cavity.

9. A liquid reagent dispensing assembly according to claim 8, further comprising a liquid reagent flow circuit joining the dip-tube liquid discharge conduit in reagent liquid flow communication with a liquid delivery chemical vapor deposition system.

10. A liquid reagent dispensing assembly according to claim 9, wherein the liquid reagent flow circuit contains a flow control valve to regulate flow rate of discharged liquid reagent through the circuit.

11. A liquid reagent dispensing assembly according to claim 8, wherein the sump cavity occupies a minor fraction of the area of the floor surface.

12. A liquid reagent dispensing assembly according to claim 8, wherein the sump cavity occupies less than 25% of the floor surface area.

13. A liquid reagent dispensing assembly according to claim 8, wherein the sump cavity has a dumbbell shape in top plan view of the floor surface.

14. A liquid reagent dispensing assembly according to claim 8, wherein the sump cavity comprises two transversely space-apart wells in liquid flow communication with one another, with one of the wells having the lower open end of the dip tube disposed therein and the other of the wells having the lower end of the liquid level sensor element disposed therein.

15. A reagent supply vessel assembly comprising:
   a closed vessel bounded by a bottom floor member and containing an interior volume for holding reagent;
   the bottom floor member having a main floor surface and containing a sump cavity, with the sump cavity being bounded at its lower end by a subfloor surface;
   a pressurized gas feed tube for flowing pressurizing gas from an exterior locus into the interior volume of the closed vessel;
a reagent discharge tube extending exteriorly of the closed vessel and into the interior volume of the closed vessel to a lower extremity terminating in the sump cavity; and
   a reagent level sensor capable of detecting the level of reagent in the sump cavity the reagent level sensor extending downwardly to a lower end positioned in the sump cavity.

16. A reagent supply vessel according to claim 15 wherein the reagent discharge tube extends through a top portion of the closed vessel and generally vertically downwardly into the sump cavity.

17. A reagent supply vessel according to claim 15 wherein the lower extremity of the reagent discharge tube is in close proximity to the subfloor surface.

18. A reagent supply vessel according to claim 15 wherein the lower extremity of the reagent discharge tube is in sufficiently close proximity to the subfloor surface to permit utilization of at least 90% of reagent liquid when reagent liquid is contained in the closed vessel.

19. A reagent supply vessel according to claim 15 wherein the pressurized gas feed tube is operationally connected to a gas flow control valve and further comprising:
   a reagent level signal transmission line operationally connecting the reagent level sensor to a central processing unit; and
   a gas control signal transmission line operationally connecting the central processing unit to the gas flow control valve;
such that when the level of reagent in the closed vessel reaches a minimum reagent head the reagent level sensor is capable of transmitting a reagent level signal in the reagent level signal transmission line to the central processing unit and the central processing unit is capable of receiving the reagent level signal from the reagent level signal transmission line and transmitting a corresponding gas control signal in the gas control signal transmission line to the gas flow control valve to close the gas flow control valve.

20. A reagent supply vessel according to claim 15 wherein the reagent discharge tube is operationally connected to a reagent flow control valve and further comprising:
   a reagent level signal transmission line operationally connecting the reagent level sensor to a central processing unit; and
   a reagent control signal transmission line operationally connecting the central processing unit to the reagent flow control valve;
such that when the level of reagent in the closed vessel reaches a minimum reagent head the reagent level sensor is capable of transmitting a reagent level signal in the reagent level signal transmission line to the central processing unit and the central processing unit is capable of receiving the reagent level signal from the reagent level signal transmission line and transmitting a corresponding reagent control signal in the reagent control signal transmission line to the reagent flow control valve to close the reagent flow control valve.

21. A reagent supply vessel according to claim 15 wherein said reagent level sensor is selected from the group consisting of: ultrasonic sensors, optical sensors and float-type sensors.

22. A reagent supply vessel according to claim 15 further comprising a reagent contained in the interior volume of the closed vessel.

23. A reagent supply vessel according to claim 22 wherein the reagent comprises a precursor for a metal selected from the group consisting of: platinum, gold, titanium, lead, palladium, zirconium, bismuth, strontium, barium, calcium, antimony, thallium and tantalum.

24. A reagent supply vessel according to claim 15 wherein the sump cavity comprises a reagent level sensor well in reagent flow communication with a reagent discharge tube well.

25. A reagent supply vessel according to claim 24 wherein the reagent level sensor well is connected to a reagent discharge tube well by a yoke passage, thereby defining a dumbbell conformation of the sump cavity.

26. A reagent supply vessel according to claim 15 wherein the sump cavity is defined at least in part by a sloping wall surface.

27. A reagent supply vessel according to claim 15 further comprising a pressurized gas source coupled to the pressurized gas feed tube.

28. A reagent supply vessel according to claim 27 wherein the pressurized gas source is selected from the group consisting of: a high pressure gas cylinder, a cryogenic air separation plant and a pressure swing air separation unit.

29. An apparatus comprising:
   a cylindrically shaped closed vessel bounded on its upper end by a top wall member and on its lower end by a bottom wall member to define therewithin an interior volume for holding reagent, the bottom wall member having a main floor surface and containing a dumbbell-shaped sump cavity;
   the sump cavity being bounded at its lower end by a subfloor surface and comprising a reagent level sensor well connected to a reagent discharge tube well by a yoke passage, thereby defining a dumbbell conformation of the sump cavity;
   a reagent level sensor extending from an upper end exterior of the vessel through a centrally located portion of the top wall member and downwardly into the interior volume of the closed vessel to a lower end in the sump cavity;

a reagent discharge tube extending from an upper end exterior of the vessel downwardly through the top wall member into the interior volume of the closed vessel to a lower end in the sump cavity, with the lower end of the reagent discharge tube being located in non-interfering proximity to the subfloor surface of the sump cavity, and with the upper end of the reagent discharge tube being coupled to a reagent flow control valve;

a pressurized gas feed tube operationally connected at one end thereof to a pressurized gas source and at another end thereof to the closed vessel for delivery of pressurized gas from the pressurized gas source into the interior volume of the vessel, the pressurized gas feed tube containing a pressurized gas flow control valve therein for control of flow of the pressurized gas therethrough;

a reagent level signal transmission line operationally connecting the reagent level sensor to a central processing unit;

a gas control signal transmission line operationally connecting the central processing unit to the gas flow control valve; and a reagent control signal transmission line operationally connecting the central processing unit to the reagent flow control valve;

such that when pressurized gas is supplied through the pressurized gas feed tube to the interior volume of the closed vessel, reagent contained therein is forced into the reagent discharge tube and out of the interior volume, and when the level of reagent in the closed vessel reaches a minimum reagent head the reagent level sensor is capable of transmitting a reagent level signal in the reagent level signal transmission line to the central processing unit and the central processing unit is capable of receiving the reagent level signal from the reagent level signal transmission line and transmitting (i) a corresponding reagent control signal in the reagent control signal transmission line to the reagent flow control valve to close the reagent flow control valve and (ii) transmitting a corresponding gas control signal in the gas control signal transmission line to the gas flow control valve to close the gas flow control valve.

30. An apparatus according to claim 29, further comprising:

a vaporizer;

a reagent feed line connecting the reagent discharge tube to the vaporizer;

a chemical vapor deposition chamber;

a vapor feed line connecting the vaporizer to the chemical vapor deposition chamber;

a heatable susceptor contained within the vapor deposition chamber and located in a receiving relationship to the vapor feed line; and an effluent discharge line connected to the chemical vapor deposition chamber;

such that reagent leaving the reagent discharge tube passes through the reagent feed line and into the vaporizer where the reagent is vaporized to form a source vapor and the source vapor upon exiting the vaporizer passes through the vapor feed line into the chemical vapor deposition chamber for contact with a substrate on the heatable susceptor and any remaining effluent is discharged through the effluent discharge line.

31. A liquid reagent dispensing system, comprising:

a reagent supply vessel having a floor with a sump cavity therein;

a discharge tube extending into and terminating in the sump cavity; and a liquid level sensor extending into and terminating in the sump cavity, to determine the level of the liquid reagent.

32. A liquid reagent supply system, comprising:

a reagent supply vessel having a floor with a sump cavity therein;

a discharge tube extending into and terminating in the sump cavity for discharge of liquid from the reagent supply vessel; and a sensor disposed in the sump cavity and operatively arranged to determine the level of the liquid reagent in the vessel.

\* \* \* \* \*

UNITED STATES PATENT AND TRADEMARK OFFICE
CERTIFICATE OF CORRECTION

PATENT NO : 6077356
DATED : June 20, 2000
INVENTOR(S) : Fred Bouchard

It is certified that error appears in the above-identified patent and that said Letters Patent are hereby corrected as shown below:

In the drawings, please replace the informal drawings of the printed patent for Figures 1-2 with the corresponding previously filed formal drawings for Figures 1-2.
Column 8, line 21 change "dip-tube" to -- dip tube --.
Column 9, line 37 after "cavity" insert -- , --.

Signed and Sealed this

Seventeenth Day of April, 2001

*Attest:*

NICHOLAS P. GODICI

*Attesting Officer*     *Acting Director of the United States Patent and Trademark Office*